(12) United States Patent
Graham et al.

(10) Patent No.: US 10,644,482 B2
(45) Date of Patent: *May 5, 2020

(54) ETCHED PLANARIZED VCSEL

(71) Applicant: FINISAR CORPORATION, Sunnyvale, CA (US)

(72) Inventors: Luke Graham, Allen, TX (US); Andy MacInnes, Allen, TX (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/351,214

(22) Filed: Mar. 12, 2019

(65) Prior Publication Data

US 2019/0207369 A1 Jul. 4, 2019

Related U.S. Application Data

(63) Continuation of application No. 15/671,433, filed on Aug. 8, 2017, now Pat. No. 10,230,215.

(Continued)

(51) Int. Cl.
*H01S 5/00* (2006.01)
*H01S 5/183* (2006.01)
(Continued)

(52) U.S. Cl.
CPC ........ *H01S 5/18311* (2013.01); *H01S 5/0421* (2013.01); *H01S 5/0425* (2013.01);
(Continued)

(58) Field of Classification Search
CPC ...... H01S 5/18311; H01S 5/42; H01S 5/2086; H01S 5/18308; H01S 5/0421;
(Continued)

(56) References Cited

U.S. PATENT DOCUMENTS 6,795,478 B2 * 9/2004 Hwang ............... H01S 5/18358
372/43.01
9,153,944 B2 * 10/2015 Lee ......................... H01S 5/423
(Continued)

FOREIGN PATENT DOCUMENTS

JP 2000312890 A 4/1999
JP 2006231316 A 9/2006
(Continued)

*Primary Examiner* — Vu A Vu
(74) *Attorney, Agent, or Firm* — Maschoff Brennan

(57) ABSTRACT

An etched planarized VCSEL includes: an active region; a blocking region over the active region, and defining apertures therein; and conductive channel cores in the apertures, wherein the conductive channel cores and blocking region form an isolation region. A method of making the VCSEL includes: forming the active region; forming the blocking region over the active region; etching the apertures in the blocking region; and forming the conductive channel cores in the apertures of the blocking region. Another etched planarized VCSEL includes: an active region; a conductive region over the active region, and defining apertures therein; and blocking cores in the apertures, wherein the blocking cores and conductive region form an isolation region. A method of making the VCSEL includes: forming the active region; forming the conductive region over the active region; etching the apertures in the conductive region; and forming the blocking cores in the apertures of the conductive region.

19 Claims, 8 Drawing Sheets

Related U.S. Application Data

(60) Provisional application No. 62/372,126, filed on Aug. 8, 2016.

(51) Int. Cl.
  *H01S 5/20* (2006.01)
  *H01S 5/042* (2006.01)
  *H01S 5/10* (2006.01)
  *H01S 5/42* (2006.01)

(52) U.S. Cl.
  CPC ........ *H01S 5/1053* (2013.01); *H01S 5/18308* (2013.01); *H01S 5/18341* (2013.01); *H01S 5/18361* (2013.01); *H01S 5/18394* (2013.01); *H01S 5/2086* (2013.01); *H01S 5/42* (2013.01); *H01S 5/18322* (2013.01); *H01S 5/18358* (2013.01); *H01S 5/209* (2013.01); *H01S 5/423* (2013.01); *H01S 2301/203* (2013.01)

(58) Field of Classification Search
  CPC .. H01S 5/0425; H01S 5/1053; H01S 5/18341; H01S 5/18361; H01S 5/18394; H01S 2301/203; H01S 5/423; H01S 5/18358; H01S 5/18322; H01S 5/209
  USPC ...................................................... 372/45.01
  See application file for complete search history.

(56) References Cited

U.S. PATENT DOCUMENTS

| | | | |
|---|---|---|---|
| 10,230,215 B2 * | 3/2019 | Graham | ................ H01S 5/0421 |
| 2002/0163947 A1 | 11/2002 | Ostergaard et al. | |
| 2013/0051418 A1 * | 2/2013 | Sumitomo | ............ H01S 5/2206 |
| | | | 372/45.01 |

FOREIGN PATENT DOCUMENTS

| | | | |
|---|---|---|---|
| JP | 6069585 B | 5/2013 |
| KR | 1020040093676 A | 11/2004 |
| KR | 100703530 B1 | 3/2007 |
| WO | 9921252 A1 | 4/1999 |

* cited by examiner

ETCHED PLANARIZED VCSEL

CROSS-REFERENCE

This patent application is a Continuation of U.S. patent application Ser. No. 15/671,433, filed Aug. 8, 2017, which claims priority to U.S. Provisional Application No. 62/372,126 filed Aug. 8, 2016, both which are incorporated herein by specific reference in their entirety.

BACKGROUND

Lasers are commonly used in many modern communication components for data transmission. One use that has become more common is the use of lasers in data networks. Lasers are used in many fiber optic communication systems to transmit digital data on a network. In one exemplary configuration, a laser may be modulated by digital data to produce an optical signal, including periods of light and dark output that represents a binary data stream. In actual practice, the lasers output a high optical output representing binary highs and a lower power optical output representing binary lows. To obtain quick reaction time, the laser is constantly on, but varies from a high optical output to a lower optical output.

Optical networks have various advantages over other types of networks, such as copper wire based networks. For example, many existing copper wire networks operate at near maximum possible data transmission rates and at near maximum possible distances for copper wire technology. On the other hand, many existing optical networks exceed, both in data transmission rate and distance, the maximums that are possible for copper wire networks. That is, optical networks are able to reliably transmit data at higher rates over further distances than is possible with copper wire networks.

One type of laser that is used in optical data transmission is a Vertical Cavity Surface Emitting Laser (VCSEL). A VCSEL has a laser cavity that is sandwiched between and defined by two mirror stacks. A VCSEL is typically constructed on a semiconductor wafer such as Gallium Arsenide (GaAs). The VCSEL includes a bottom mirror constructed on the semiconductor wafer. Typically, the bottom mirror includes a number of alternating high and low index of refraction layers. As light passes from a layer of one index of refraction to another, a portion of the light is reflected. By using a sufficient number of alternating layers, a high percentage of light can be reflected by the mirror.

An active region that includes a number of quantum wells is formed on the bottom mirror. The active region forms a PN junction sandwiched between the bottom mirror and a top mirror, which are of opposite conductivity type (e.g. one p-type mirror and one n-type mirror). Notably, the notion of top and bottom mirrors can be somewhat arbitrary. In some configurations, light could be extracted from the wafer side of the VCSEL, with the "top" mirror totally reflective—and thus opaque. However, for purposes of this invention, the "top" mirror refers to the mirror from which light is to be extracted, regardless of how it is disposed in the physical structure. Carriers in the form of holes and electrons are injected into the quantum wells when the PN junction is forward biased by an electrical current. At a sufficiently high bias current the injected minority carriers form a population inversion in the quantum wells that produces optical gain. Optical gain occurs when photons in the active region stimulate electrons to recombine with holes in the conduction band to the valance band which produces additional photons. When the optical gain exceeds the total loss in the two mirrors, laser oscillation occurs.

The active region may also include an oxide aperture formed using one or more oxide layers formed in the top and/or bottom mirrors near the active region. The oxide aperture serves both to form an optical cavity and to direct the bias current through the central region of the cavity that is formed. Alternatively, other means, such as ion implantation, epitaxial regrowth after patterning, or other lithographic patterning may be used to perform these functions.

A top mirror is formed on the active region. The top mirror is similar to the bottom mirror in that it generally comprises a number of layers that alternate between a high index of refraction and a lower index of refraction. Generally, the top mirror has fewer mirror periods of alternating high index and low index of refraction layers, to enhance light emission from the top of the VCSEL.

Illustratively, the laser functions when a current is passed through the PN junction to inject carriers into the active region. Recombination of the injected carriers from the conduction band to the valence band in the quantum wells results in photons that begin to travel in the laser cavity defined by the mirrors. The mirrors reflect the photons back and forth. When the bias current is sufficient to produce a population inversion between the quantum well states at the wavelength supported by the cavity, optical gain is produced in the quantum wells. When the optical gain is equal to the cavity loss, laser oscillation occurs and the laser is said to be at threshold bias and the VCSEL begins to 'lase' as the optically coherent photons are emitted from the top of the VCSEL.

U.S. Pat. No. 8,774,246 describes light emitting devices with a current blocking region formed using a depleted semiconductor heterojunction interface. Using this type of heterojunction interface for blocking allows a conductive channel to be formed by applying location selective specific doping changes either to the blocking region, or to the center conductive region itself. In this approach, doping is delivered via a diffusion mechanism.

Zou et al. (D. Zhou and L. J. Mawst, "High-Power Single-Mode Antiresonant Reflecting Optical Waveguide—Type Vertical-Cavity-Surface-Emitting Lasers," IEEE Journal of Quantum Electronics, 58, no 12, 1599-1606 (2002)) describes light emitting devices that use a heterojunction current blocking region and a center etched conductive channel, but the subsequent regrowth used in this design is not planarizing and does not form an index guiding optical mode in the center channel of the device. Instead, antiresonant devices with larger, optical modes that can leak to the adjacent area are formed. While this may be useful for very large emitters or closely placed arrays, the design approach is not desirable for single high optical output efficiency and high modulation bandwidth VCSELs.

In Chriovsky et al. (L. M. F. Chriovsky, W. S. Hobson, R. E. Leibenguth, S. P. Hui, J. Lopata, G. J. Zydzik, G. Giaretta, K. W. Goossen, J. D. Wynn, A. V. Krishnamoorthy, B. J. Tseng, J. M. Vandenberg, L. A. D'Asaro, "Implant-Apertured and Index-Guided Vertical-Cavity-Surface-Emitting Lasers ($I^2$-VCSELs)," IEEE Photonics Technology Letters, 11, no 5, 500-502 (1999)) the current blocking region is formed by ion implantation damage, and not through use of a low doped hetero-junction. The index guided optical mode is formed via an etched mesa as in U.S. Pat. No. 8,774,246.

The subject matter claimed herein is not limited to embodiments that solve any disadvantages or that operate only in environments such as those described above. Rather, this background is only provided to illustrate one example technology where some embodiments described herein may be practiced.

SUMMARY

In one embodiment, an etched planarized vertical cavity surface emitting laser (VCSEL) can include: an active region; a blocking region over the active region, the blocking region defining one or more apertures therein; and one or more conductive channel cores in the one or more apertures of the blocking region, wherein the one or more conductive channel cores and blocking region form an isolation region. In one aspect, the VCSEL can include a bottom mirror region below the active region, and a top mirror region above the isolation region. In one aspect, the blocking region has a thickness from 1 nm to 500 nm. In one aspect, the conductive channel core has a diameter of about 1 micron to about 10 microns. In one aspect, the VCSEL includes a plurality of the conductive channel cores in the blocking region. In one aspect, the conductive channel core has higher refractive index than the blocking region. In one aspect, the VCSEL is devoid of one or more of: an oxide aperture; oxidation; a mesa. In one aspect, the VCSEL can include a conductive wing layer integrated or in contact with tops of the one or more conductive channel cores. In one aspect, the one or more conducive channel cores are planarized. In one aspect, the one or more conducive channel cores and mirror layers of the top mirror region are planarized.

In one embodiment, a method of making a VCSEL having a blocking region with one or more conductive channel cores in the blocking region is provided. Such a method of making an embodiment of the VCSEL can include: forming the active region over a substrate; forming the blocking region over the active region; etching the one or more apertures in the blocking region; and forming the one or more conductive channel cores in the one or more apertures of the blocking region. In one aspect, the method can include: coating a top of the blocking region with a chemical agent that inhibits etching while leaving one or more regions without the chemical agent; and etching the one or more of the apertures in the blocking region in the one or more regions without the chemical agent. In one aspect, the method can include filling the one or more of the apertures in the blocking region with the one or more conductive channel cores by MOCVD. In one aspect, the method can include removing the chemical agent that inhibits the etching after the etching to form the one or more apertures and before the filling of the one or more apertures with the one or more conductive channel cores. In one aspect, the method can include forming the conductive channel core to extend through the blocking region and contact the active region or contact a top spacer region that is above the active region. In one aspect, the method can include forming a plurality of the conductive channel cores in the common blocking region. In one aspect, the method can include forming a conductive wing layer so as to be integrated or in contact with tops of the one or more conductive channel cores. In one aspect, the method can include planarizing a top surface of the one or more conducive channel cores.

In one aspect, the an etched planarized vertical cavity surface emitting laser (VCSEL) can include: an active region; a conductive region over the active region, the conductive region defining one or more apertures therein; and one or more blocking cores in the one or more apertures of the conductive region, wherein the one or more blocking cores and conductive region form an isolation region. Accordingly, all of the teachings and embodiments of a VCSEL having a blocking region with conductive channel cores therein may be reversed so that the conductive region has blocking cores therein. As such, the features described herein may be switched so that the embodiment of the VCSEL with the conductive region having blocking cores therein is provided.

In one embodiment, a method of making the VCSEL having the conductive region has blocking cores there is provided. Such a method can include: forming the active region over a substrate; forming the conductive region over the active region; etching the one or more apertures in the conductive region; and forming the one or more blocking cores in the one or more apertures of the conductive region. Accordingly, all of the teachings and embodiments of making a VCSEL having a blocking region with conductive channel cores therein may be reversed so that the method produces a conductive region that has blocking cores therein. As such, the features of the methods described herein may be switched so that the embodiment of the VCSEL with the conductive region having blocking cores therein is made.

BRIEF DESCRIPTION OF THE FIGURES

The foregoing and following information as well as other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

Figure 1:
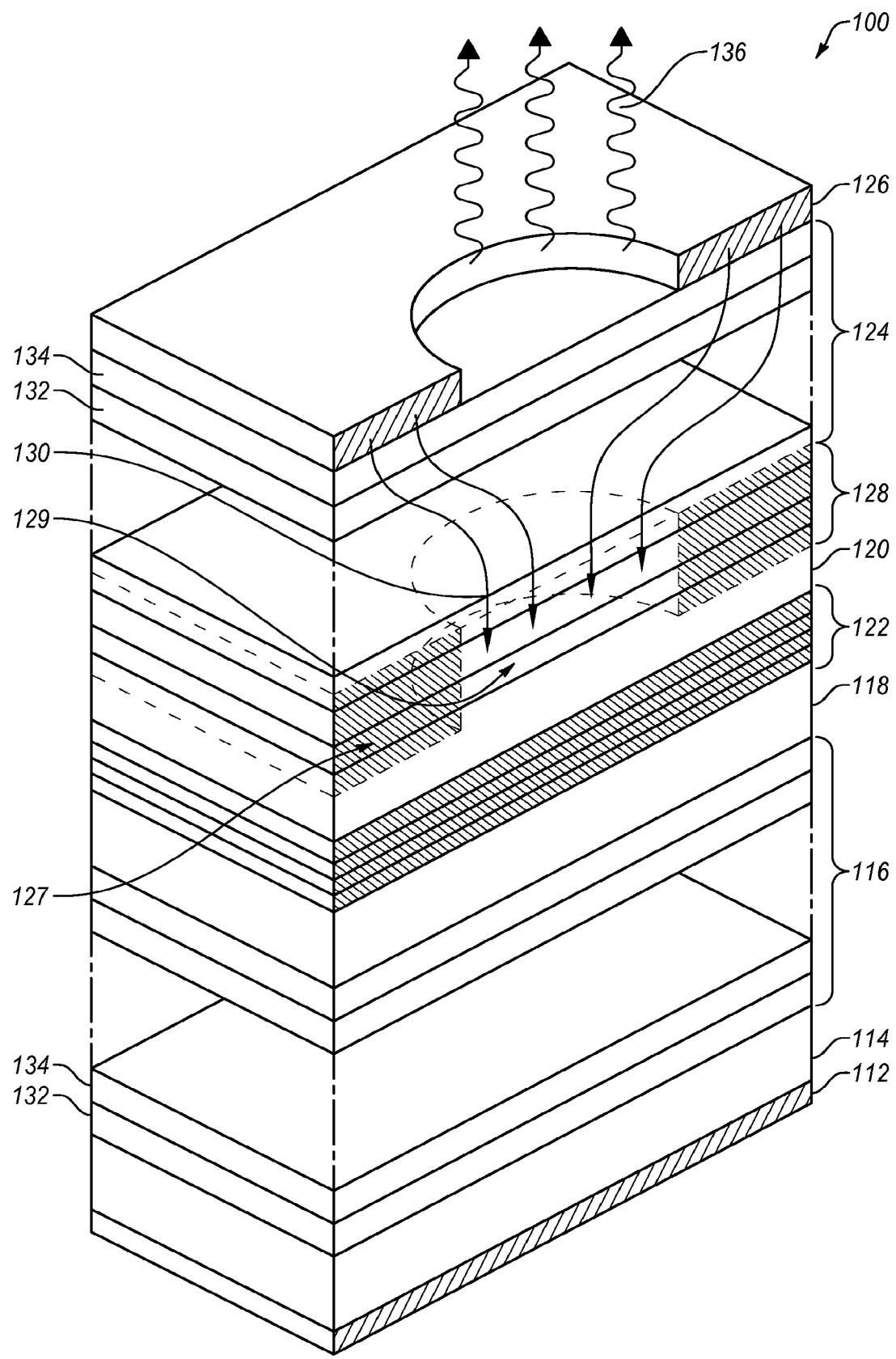
FIG. 1 is a schematic of an embodiment of a VCSEL operating environment.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

Generally, the present advancement in VCSEL technology relates to a blocking region and conducting region formed by etching a central region of the blocking region and depositing a conducting region therein. The conducting region can include a material that is more electrically conducting than the material of the blocking region during operation of the VCSEL and light emission in an active region. Accordingly, the blocking region and conducting region can form a heterojunction for selective current guidance. The conducting region can form a conducting channel through the blocking region. The conducting region may be planarized by forming a portion of the conducting region over the blocking region. Planarized layers, such as mirror layers, can be formed over the conducting region. Otherwise, the VCSEL can be prepared as standard in the industry or as in the incorporated references or described herein.

The semiconductor devices of the present invention can be manufactured from any type of semiconductor. Examples of suitable materials include III-V semiconductor materials (e.g., prepared from one or more Group III material (boron (B), aluminium (Al), gallium (Ga), indium (In), thallium (Tl), and ununtrium (Uut)) and one or more Group V materials (nitrogen (N), phosphorus (P), arsenic (As), antimony (Sb), bismuth (Bi) and ununpentium (Uup) (unconfirmed))) and optionally some type IV materials.

The semiconductor device can include an active region having one or more quantum wells and one or more quantum well barriers. The quantum wells and quantum well barriers can be separated by one or more transitional layers therebetween. The transitional layers may also be referred to as interfacial layers as they are located at the interface between the quantum wells and quantum well barriers. However, the active region can be configured as any known or developed in the art of VCSELs.

Optionally, electrical confining layers can sandwich the active region and provide optical gain efficiency by confining carriers to the active region. The confining layers can have a region of high energy band gap which in many III-V compounds translates to high aluminum content (e.g., 70%-100% Al for the type III material). The aluminum content can be selected to give the material a relatively wide band gap, as compared to the band gap in the quantum well barriers of the active region. The wide band gap material can give the confining layer good carrier confinement and can increase the efficiency in the active region. In an exemplary embodiment, the high aluminum region may also include an increase in doping. The confining layer can be doped with a p-type or n-type dopant depending on whether the confinement barrier is on the n-side or p-side of the active region.

The heterojunction conductive channel configuration can provide improved fiber optic transceiver reliability, electro-optical bandwidth, and link distances by allowing implementation of small aperture (e.g., 2-6 μm) VCSEL devices. In high power VCSELs, the heterojunction conductive channel configuration allows higher maximum power per VCSEL, and more emitters per unit area in dense arrays.

This heterojunction conductive channel configuration enables more efficient mass production of guided mode VCSELs by allowing use of one or more MOCVD (metalorganic chemical vapor deposition) crystal growth steps in fabrication. As such, the process can omit lateral steam oxidization, or formation of any oxide aperture.

FIG. 1 shows a planar, current-guided, VCSEL 100 having periodic layer pairs for top (124) and bottom (116) mirrors. A substrate 114 is formed on a bottom contact 112 and is doped with a first type of impurities (i.e., p-type or n-type dopant). A bottom mirror stack 116 is formed on substrate 114 and an optional bottom confining layer 118 is formed on the bottom mirror stack 116. An active region 122 is formed over the bottom mirror stack 116, or over the bottom confining layer 118 (when present). An optional top confining layer 120 is formed over the active region 122. In one optional aspect, the bottom confining layer 118 and a top confining layer 120 sandwich the active region 122. An isolation region 128 is formed over the active region 112 or over the optional top confining layer 120. The isolation region includes a lateral region blocking region 127 and a central conducting channel core 129. The bottom confining layer 118 and/or top confining layer 120 may be a spacer region between the active region and isolation region. Alternatively, the bottom confining layer 118 and/or top confining layer 120 may be a conducting region. Thus, any spacer region bounding the active region may be a confining region, conducting region, or semiconductor spacer that is not confining or conducting.

An upper mirror stack 124 is formed over the isolation region 128. A metal layer 126 forms a contact on a portion of stack 124. However, other VCSEL configurations may also be utilized, and various other VCSEL layers or types of layers can be used.

An isolation region 128 restricts the area of the current flow 130 through the active region 122. Isolation region 128 can be formed by to include the lateral region blocking region 127 and a central conducting channel core 129 by depositing the blocking region 127, forming an aperture therein that is then filled with the central conducting channel core 129. The isolation region 128 can include a single layer blocking region 127 or multiple layers of blocking layers, and/or a single layer central conducting channel core 129 or multiple layers of central conducting channel core layers.

Mirror stacks 116 (bottom) and 124 (top) can be distributed Bragg reflector (DBR) stacks, and include periodic layers (e.g., 132 and 134, but may be switched from what is shown). Periodic layers 132 and 134 are typically AlGaAs and AlAs, respectively, but can be made from other III-V semiconductor materials. Mirror stacks 116 and 124 can be doped or undoped and the doping can be n-type or p-type depending on the particular VCSEL design. However, other types of VCSEL mirrors may be used.

Metal contact layers 112 and 126 can be ohmic contacts that allow appropriate electrical biasing of VCSEL 100. When VCSEL 100 is forward biased with a voltage on contact 126 different than the one on contact 112, active region 122 emits light 136, which passes through top mirror stack 124. Those skilled in the art will recognize that other configurations of contacts can be used to generate a voltage across active region 122 and generate light 136.

Figure 2:
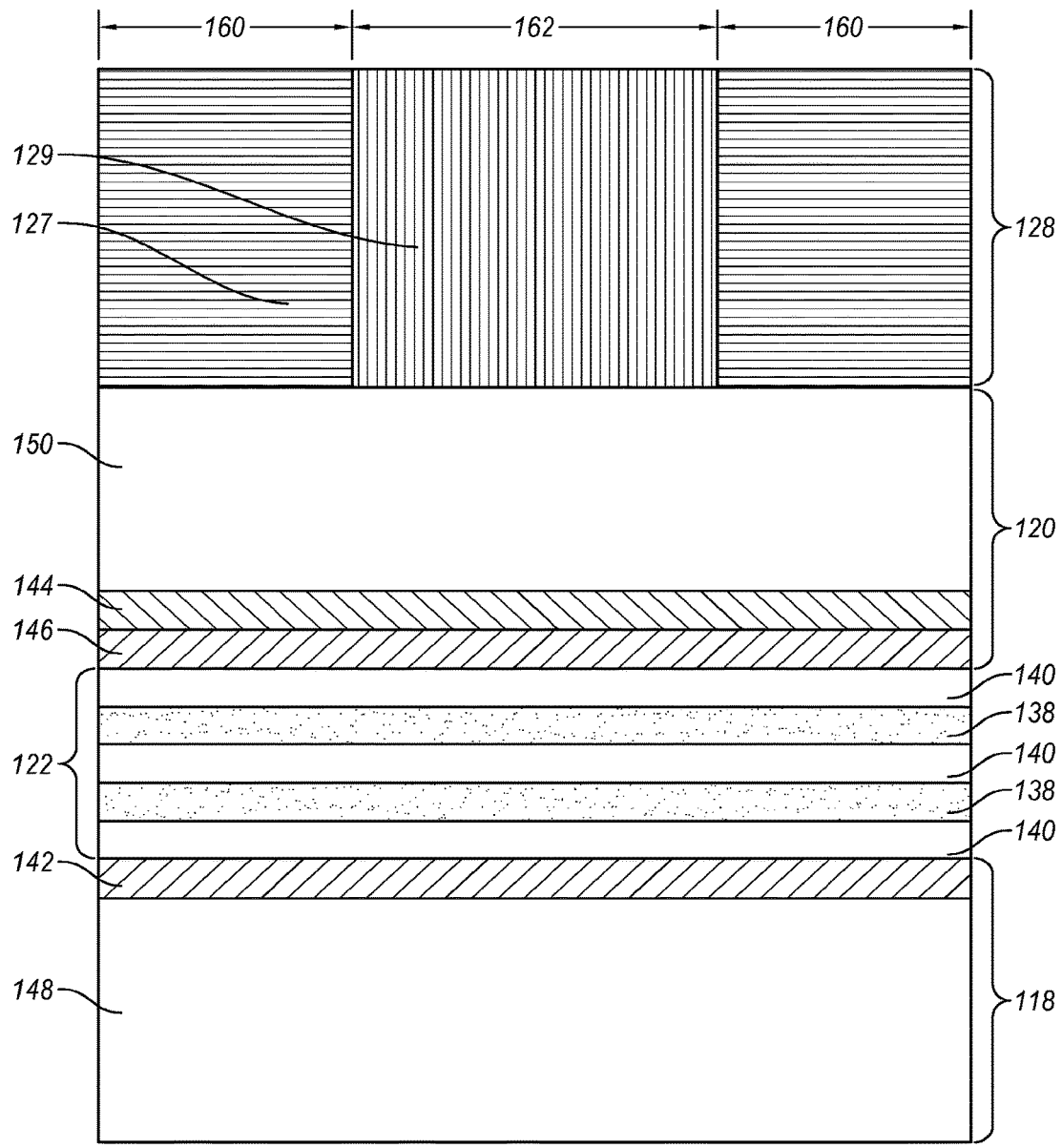
FIG. 2 is a schematic of an embodiment of a VCSEL layered semiconductor operating environment.

FIG. 2 illustrates the active region 122 and confining layers 118 and 120 under isolation region 128 having the blocking region 127 and central conducting channel core 129. The blocking region 127 forms the outer current blocking regions 160, and the central conducting channel core 129 forms the central mode confinement region 162. Active region 122 is formed from one or more quantum wells 138 that are separated by quantum well barriers 140, where the transition layers may be the lines between the quantum wells 138 and barriers 140. The confining layers 118 and 120 may optionally include high aluminum content regions 142 and 144, respectively. The high aluminum content regions provide good carrier confinement in active region 122.

Confining region 120 can include a ramp region 146 that is positioned between active region 122 and high aluminum content region 144. As discussed below, the combination of high aluminum content region 144 and the ramp region 146 provide an injection structure with good carrier confinement and good electron injection.

Depending on the design of the VCSEL device and the thickness of high aluminum content regions 142 and 144, the confining regions 118 and 120 can optionally include spacer layers 148 and 150, respectively. The thickness of spacer layers 148 and 150 can be dependent upon the kind of VCSEL device being fabricated. In a vertical cavity resonant device such as a VCSEL, or VCSEL the spacer layers provide resonant spacing between mirrors and provide that the quantum wells of the active region are centered on a peak of the optical field if desired.

The confining layers 118 and 120 and active region 122 can be formed from one or more types of semiconductor materials, such as GaAs, AlAs, InP, AlGaAs, InGaAs, InAlAs, InGaP, AlGaAsP, AlGaInP, InGaAsP, InAlGaAs, SiGe, or the like.

In one example, the lower electrical confining layer is AlInP. In another example, the upper electrical confining layer can be AlInGaP.

Figure 2A:
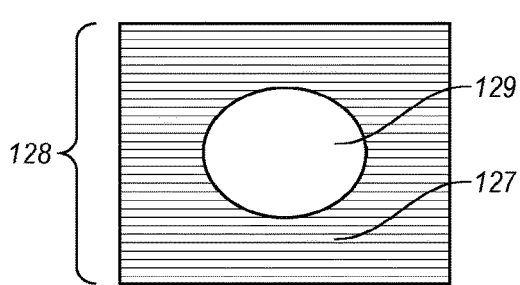
FIG. 2A shows a top view with a squared cross-section of an isolation region.
Figure 2B:
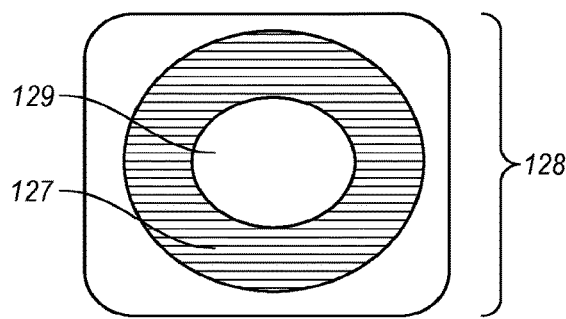
FIG. 2B shows a top view with a circular cross-section of an isolation region with etching to form a mesa.

FIG. 2A shows a top view with a squared cross-section of an isolation region 128. FIG. 2B shows a top view with a circular cross-section of an isolation region 128 with etching to form a mesa. A single chip may have a plurality of the isolations regions 128 either planar as in FIG. 2A or etched to have a plurality of mesas as in FIG. 2B on a single chip.

The VCSEL heterojunction conductive channel configuration can be formed to include a heterojunction current blocking region, with a conductive channel formed by etching an aperture in the blocking region, and a higher refractive index conductive channel core being deposited in the etched aperture. The blocking region can be a lower refractive index perimeter. The refractive index of the blocking region being lower can be comparative to the higher refractive index of the conductive channel core. This allows formation of guided optical modes. Now with the heterojunction conductive channel configuration, a VCSEL or VCSEL array can be more readily fabricated using standard MOCVD technology and other standard fabrication techniques that are currently employed in high volume VCSEL manufacturing.

Figure 3:
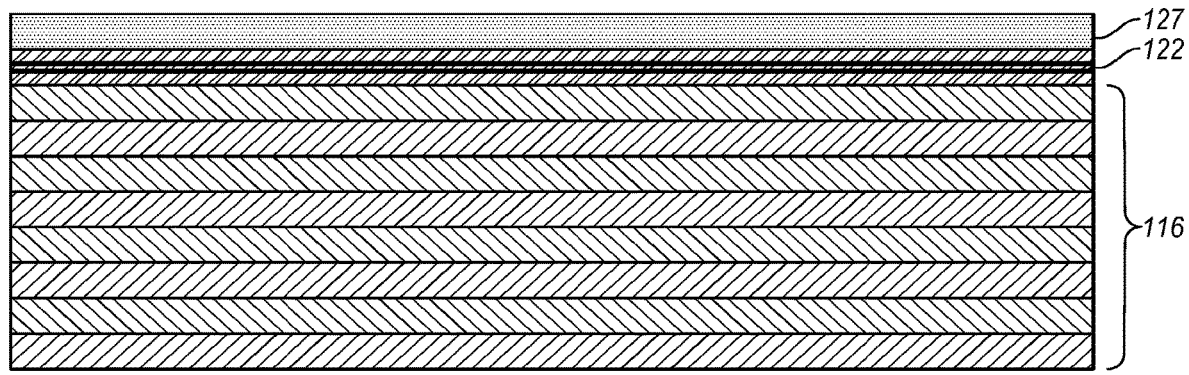
FIG. 3 is a diagram of first growth showing N-type DBR mirrors, active region with QWs capped with a blocking region.

In one embodiment, a method of manufacture of the VCSEL with the heterojunction conductive channel configuration can include forming a mirror region 116, forming an active region 122 over the mirror region 116, and forming a blocking region 127 over the active region 122 as shown in FIG. 3. The formations can be by MOCVD. In one example, the structure can include an undoped blocking layer 127 (e.g., InGaP, such as $In_{0.48}Ga_{0.52}P$), which is lattice matched to GaAs and AlGaAs, as shown in FIG. 3. The blocking layer 127 is not subject to aggressive oxidation in air that interferes with MOCVD based re-growth. Thus, the use of MOCVD can be beneficial for forming the heterojunction conductive channel configuration.

Figure 4:
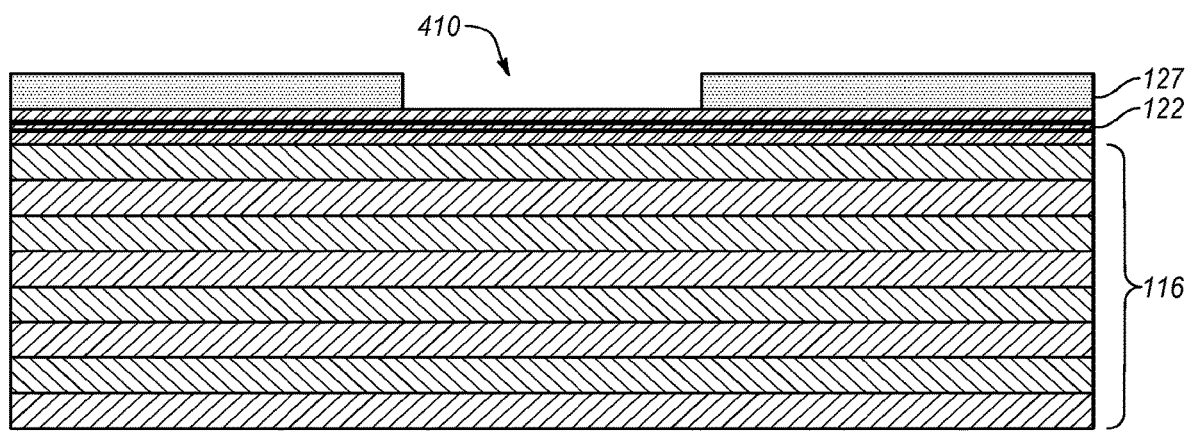
FIG. 4 is a diagram showing an etched opening in the blocking region.
Figure 5:
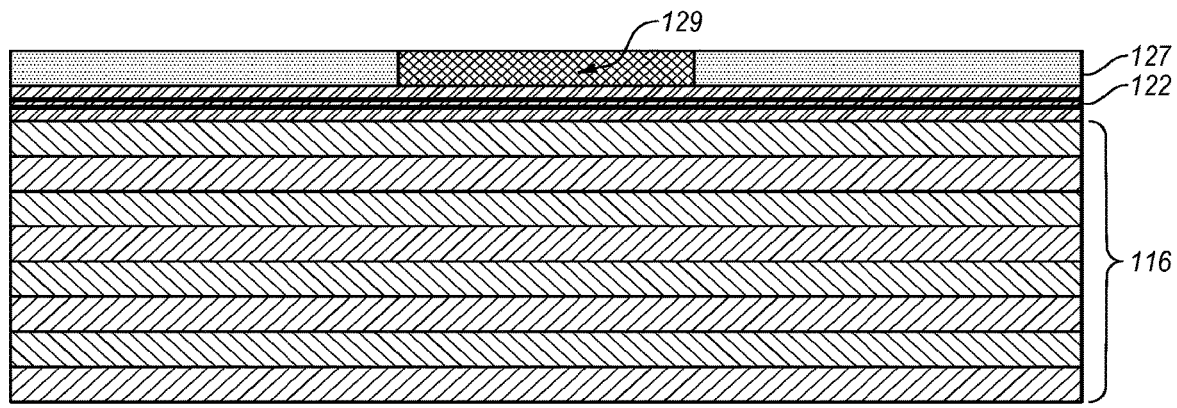
FIG. 5 is a diagram showing planarizing regrowth that forms an index guiding, conductive channel.
Figure 5A:
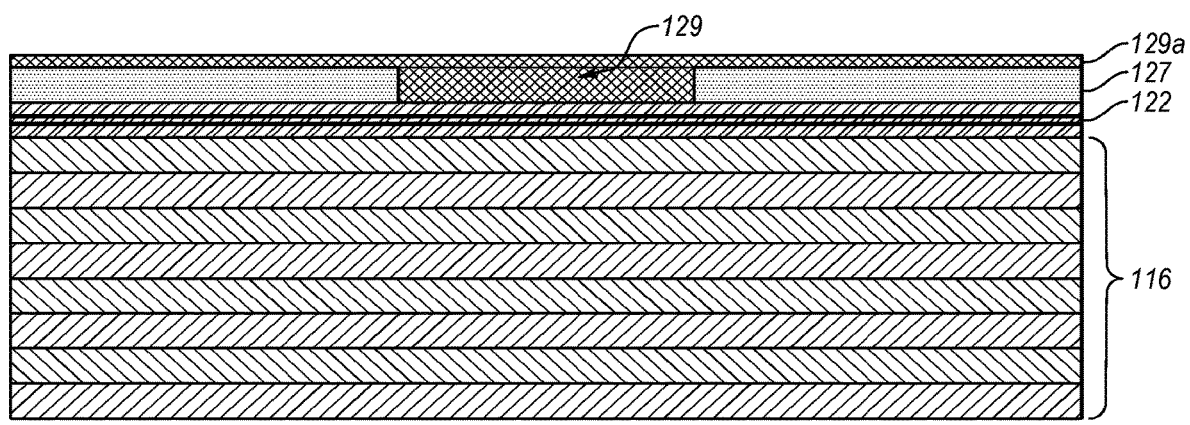
FIG. 5A is a diagram showing planarizing regrowth that forms an index guiding, conductive channel topped with a planar wings layer that covers the blocking region.
Figure 6:
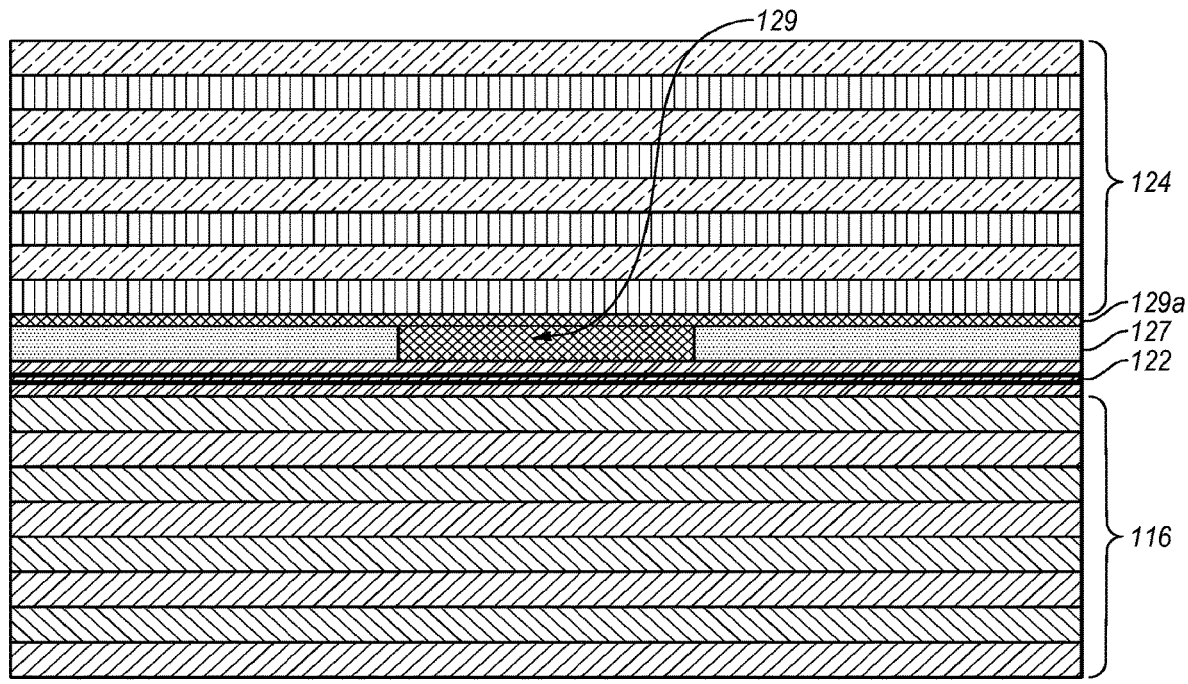
FIG. 6 is a diagram showing planarizing regrowth that forms the index guiding, conductive channel topped with a planar wings layer that covers the blocking region and a P-type DBR mirror over the planar wings layer.

The blocking layer 127 can a center region selectively removed by wet chemical etch to transition from the structure of FIG. 3 to the structure of FIG. 4. After etching the aperture 410 in the blocking region (which aperture 410 is a recess with the active region 122 or top confining region 120 as its base with the blocking region 127 as the side walls extending from the base), a conductive channel core 129 is formed in the etched aperture 410 by planarizing regrowth as shown in FIG. 5, such as by using a higher index of refraction material (compared to the blocking region), such as $Al_{0.15}Ga_{0.85}As$. The planarizing regrowth is performed to fill the etched aperture 410 with the conductive channel core 120, and then to form any optional regions (e.g., conductive plane with wings 129a) as shown in FIG. 5A, and mirror regions 124 over the etched region, as shown in FIG. 6. The planarizing regrowth is implemented by selection of MOCVD growth parameters to obtain higher attainable growth rates inside the aperture 410. A selective area regrowth, followed by a top P-doped mirror (e.g., distributed Bragg reflector—DBR) growth can also be used in to achieve planarization. When the bottom mirror is P-doped the top mirror can be N-doped and the other layers of the VCSEL correspondingly formulated.

Figure 6A:
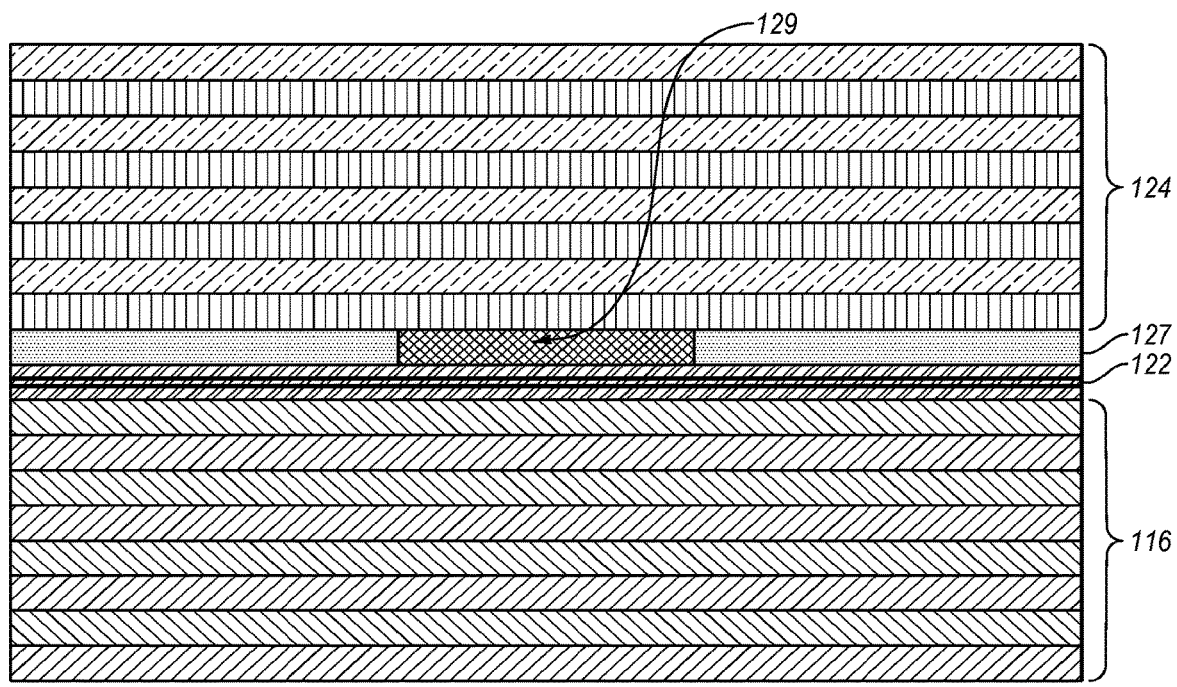
FIG. 6A is a diagram showing planarizing regrowth that forms the index guiding, conductive channel (without the planar wings layer) and a P-type DBR mirror over the planar wings layer.

Accordingly, FIG. 3 shows the first growth of a DBR mirror 116, active region 122, and blocking region 127. FIG. 4 shows the etched aperture 410 in the blocking region 127. FIG. 5 shows a planarizing regrowth that forms the index guiding, conductive channel core 129. FIG. 5A shows planarizing regrowth that forms index guiding conductive channel with a conductive plane with wings 129a over the conductive channel core 129. FIG. 6 shows the planarizing layers of the top mirror 124. FIG. 6A shows an option where there is no conductive plane with wings 129a over the conductive channel core 129, and instead the top mirror 124 is directly over the conductive channel core 129 and lateral blocking region 127.

In one embodiment, the present VCSEL can be configured to include a center conductive channel formed by etching the blocking region away, and having the etched region filled with a conducting region and then having a subsequent series of planarizing layers deposited on top of the blocking region and conducting region to form an index guided optical mode.

In one embodiment, the embodiments and processing can be reversed so that the conductive layer is applied instead of the blocking layer, and then the conductive layer is etched for form a cavity that is then filled with the blocking layer so as to form a blocking core. However, the blocking core would not have a blocking plane with wings in this embodiment.

Figure 7:
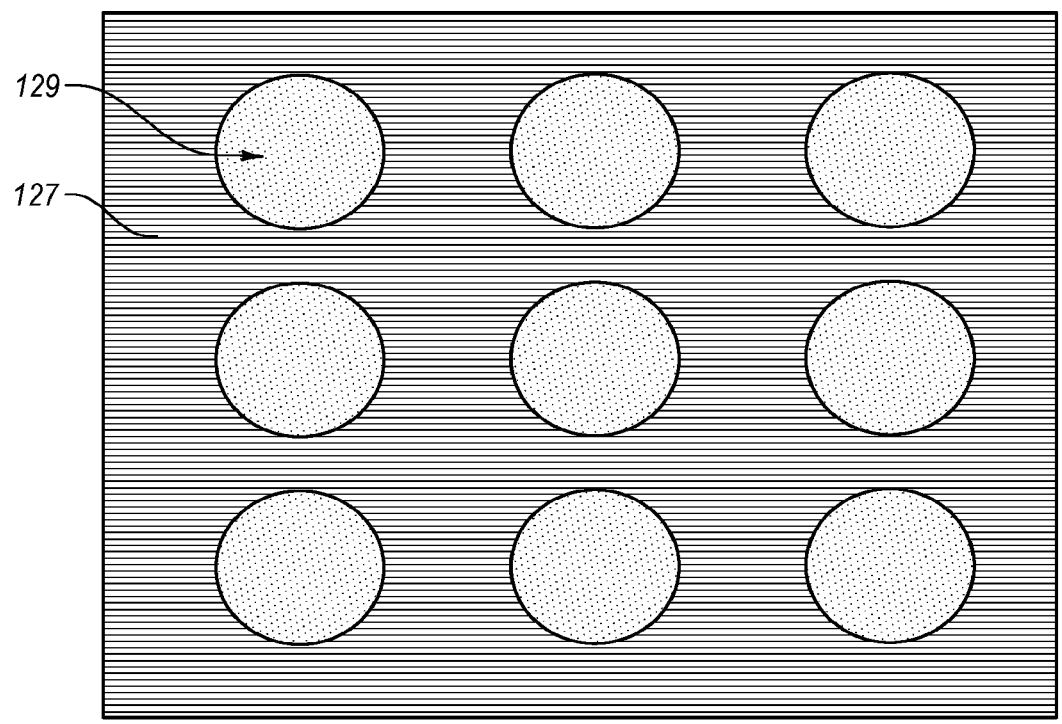
FIG. 7 is a diagram showing a plurality of conductive channel cores in a common blocking layer.

In one embodiment, a single substrate can include a plurality of VCSEL emitters, which can be formed into an array. A macro substrate with a macro blocking region can be selectively etched and refilled with conducting channel cores in a number of locations to form the array of VCSELs. Each conducting channel core can be an individual light emitting device that use a heterojunction current blocking region and a center etched conductive channel, and the entirety of the conducting channels and blocking regions can receive subsequent regrowth thereof with planarizing layers. FIG. 7 shows such a laser array of VCSEL emitters on a single substrate. Each VCSEL emitter can include a conductive channel core 129, where all VCSEL emitters are each surrounded by a common blocking layer 127. FIG. 7B shows that the etching can be done to result in conductive channel cores 129 having complex shapes, which can be accomplished by selective deposition of a protectant that leaves complex shapes unprotected that are then etched into complex etched shapes.

The present configuration can result in a VCSEL devoid of an oxide aperture because the processing does not use lateral oxidation that can damage the semiconductor layers. The use of the blocking layer with conductive channel core uses semiconductor material with better thermal conductivity. The thermal conductivity is better because of aluminum arsenide layers in the top mirror, and processing does not oxidize them. The bottom mirror can use binary materials. The reliability of the VCSEL can also be increased because the manufacturing method does not include cutting a trench near the active region and oxidizing into the semiconductor.

Reliability of the VCSEL can be improved when the device operates at lower temperatures. In the current state of the art, the oxide confined VCSEL heats more because of the low thermal conductivity of the oxide layer. Trenches are cut in the device to allow the oxide layer to form. As such, the VCSELs provided herein can be devoid of such an oxide layer and/or trenches that allow oxide layers to form.

Most of the problems with laser device reliability are related to some kind of chemical process being set in motion at the tip of that oxidation layer. Some reliability problems occur at the oxide tip because of the stress induced by the oxide layer. Most reliability problems are exacerbated at high temperatures. The oxide confined lasers have reliability problems as a result of physical interaction with oxidation layer, were stress at the oxidation layer drives defects to form in semiconductor layers. In view thereof, it is expected that the lasers described herein should have less defects and less defect formation even at higher temperatures by lacking the oxide layers. The present implant VCSELS can have improved reliability by not having the oxide layer.

Now with the present technology, very small apertures can be formed in a blocking layer to form one or more laser devices with improved reliability. The very small aperture laser devices can now be very close to each other. For example, the individual conductive channel cores can have diameter (or other cross-dimensions) of from 1 micron to 10 microns, from 1.5 microns to 5 microns, from 2 microns to 4 micros, or about 2.5-3 microns. The individual conductive channel cores can be separated by distances (e.g., minimum distance apart) from 1 micron to 10 microns, from 1.5 microns to 5 microns, from 2 microns to 4 micros, or about 2.5-3 microns. This can include 1, 2, 3, 4, 5, 6, 7, 8, 9, 10, or more lasers on a common chip, where one or more (e.g., 4 or 5) can be coupled into a common optical fiber.

Common to chemical etching, a mask can be used to define the etching part and non-etching part. A mask or other chemical blocking material can be placed on the blocking layer with apertures defining where the chemical etch will occur. In one example, MOCVD deposition is used to form the conductive channel core. In one example, the non-etching region is defined by a placing a layer of $SiO_2$ everywhere on the blocking layer except for leaving the one or more holes (circular or other shape) that is the aperture. Then the $SiO_2$ is removed. After removing the $SiO_2$ then MOCVD fills the holes with the higher refractive index material to form the conductive channel cores. Then the conductive channel core is flattened out by adding more higher refractive index material to form the layer with wings. The mirror can then be formed over the isolating region.

In one embodiment, the temperature of the MOCVD process can be modulated while filling the aperture during the regrown can result in more material growing in the hole and then it planerizes later. The temperature of the regrowth process can determine how much planarization occurs.

In one aspect, the manufacturing process omits etching or otherwise forming a mesa. Accordingly, the laser device does not include a raised area in the center of where the laser will be.

In one embodiment, the blocking region is InGaP. And that material, its 48% I, 52% Ga, along with P. This InGaP material is lattice matched to GaAs.

Figure 7A:
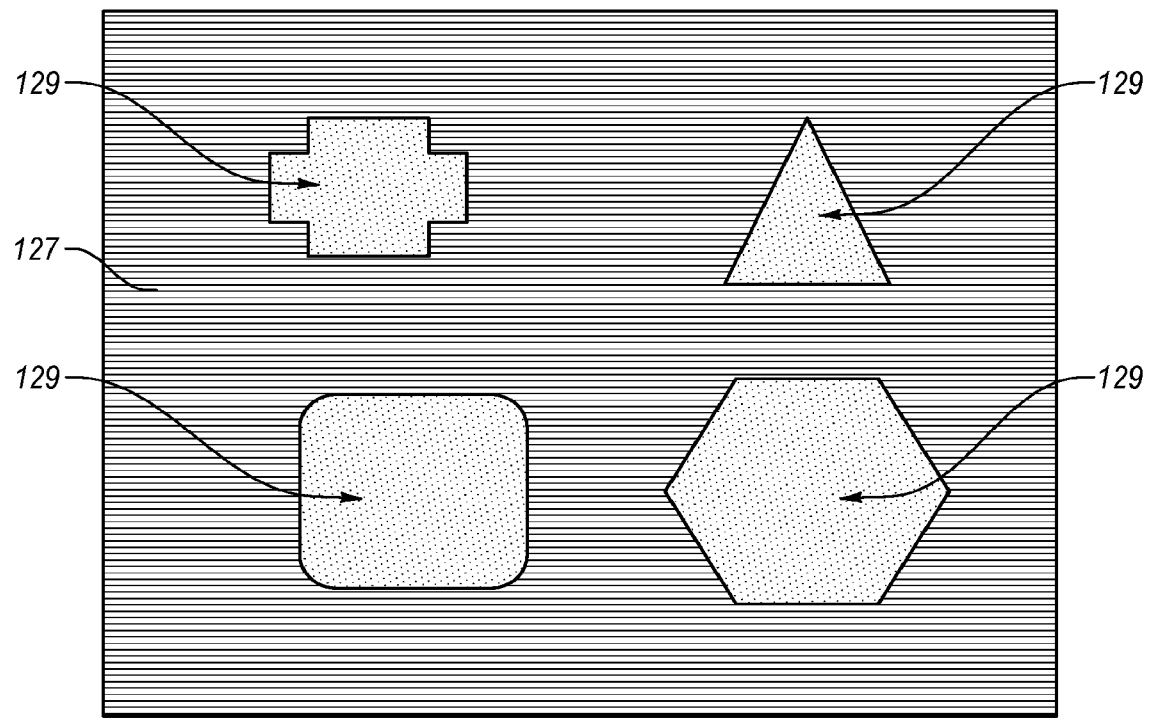
FIG. 7A is a diagram showing a plurality of conductive channel cores having complex shapes in a common blocking layer.

The selective etching allows formation of various shaped apertures that can then be filled into shaped conductive channel cores 129 as shown in FIG. 7A.

Figure 8:
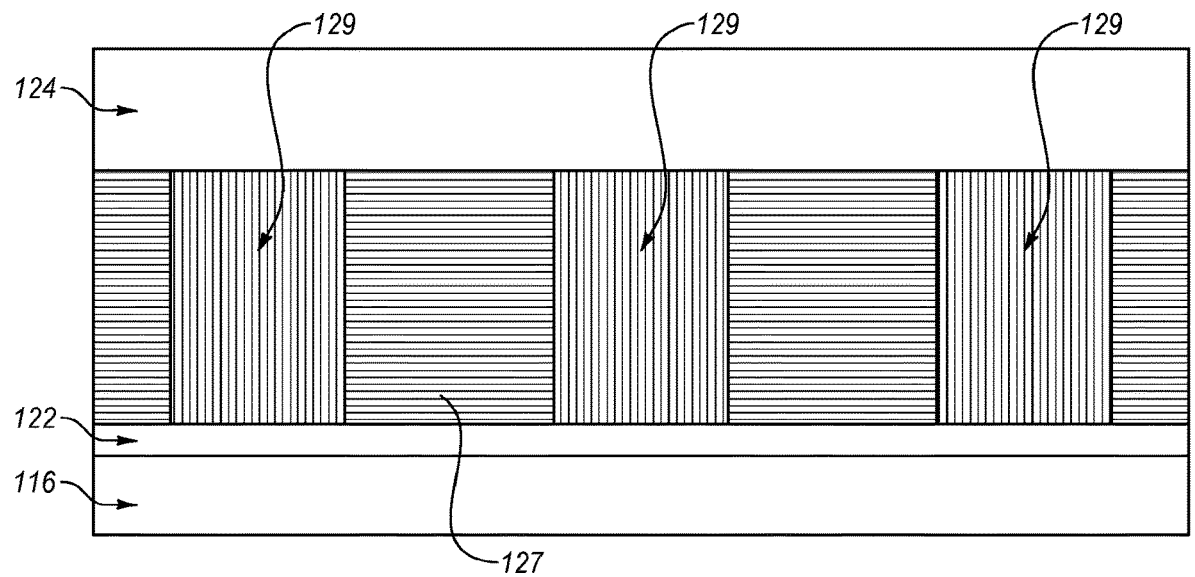
FIG. 8 is a cross-sectional side view of in isolation region having a blocking region with a plurality of conductive channel cores therein.

FIG. 8 shows a cross sectional side view of a semiconductor having a blocking 127 region with a plurality of apertures filled with the conductive channel cores 129.

Figure 8A:
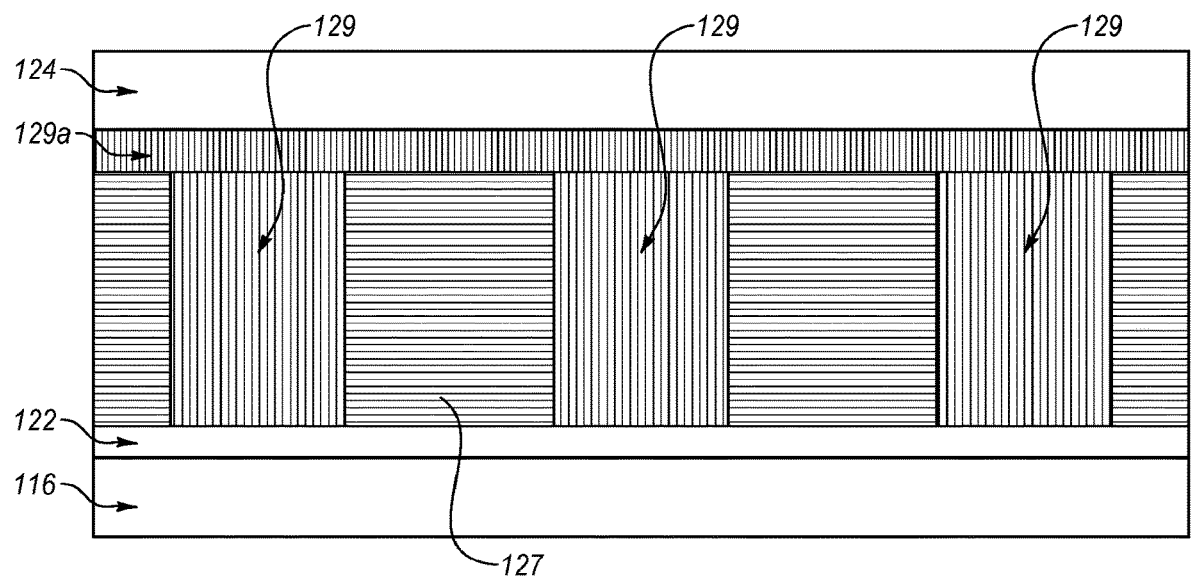
FIG. 8A is a cross-sectional side view of in isolation region having a blocking region with a plurality of conductive channel cores therein and the planarized wing layer over the plurality of conductive channel cores and blocking region.

FIG. 8A shows a cross sectional side view of a semiconductor having a blocking region 127 with a plurality of apertures filled with the conductive channel cores 129, and a unitary conductive wing layer 129a integrated with or located on top of and contacting a plurality or all of the conductive channel cores 129.

Figure 9:
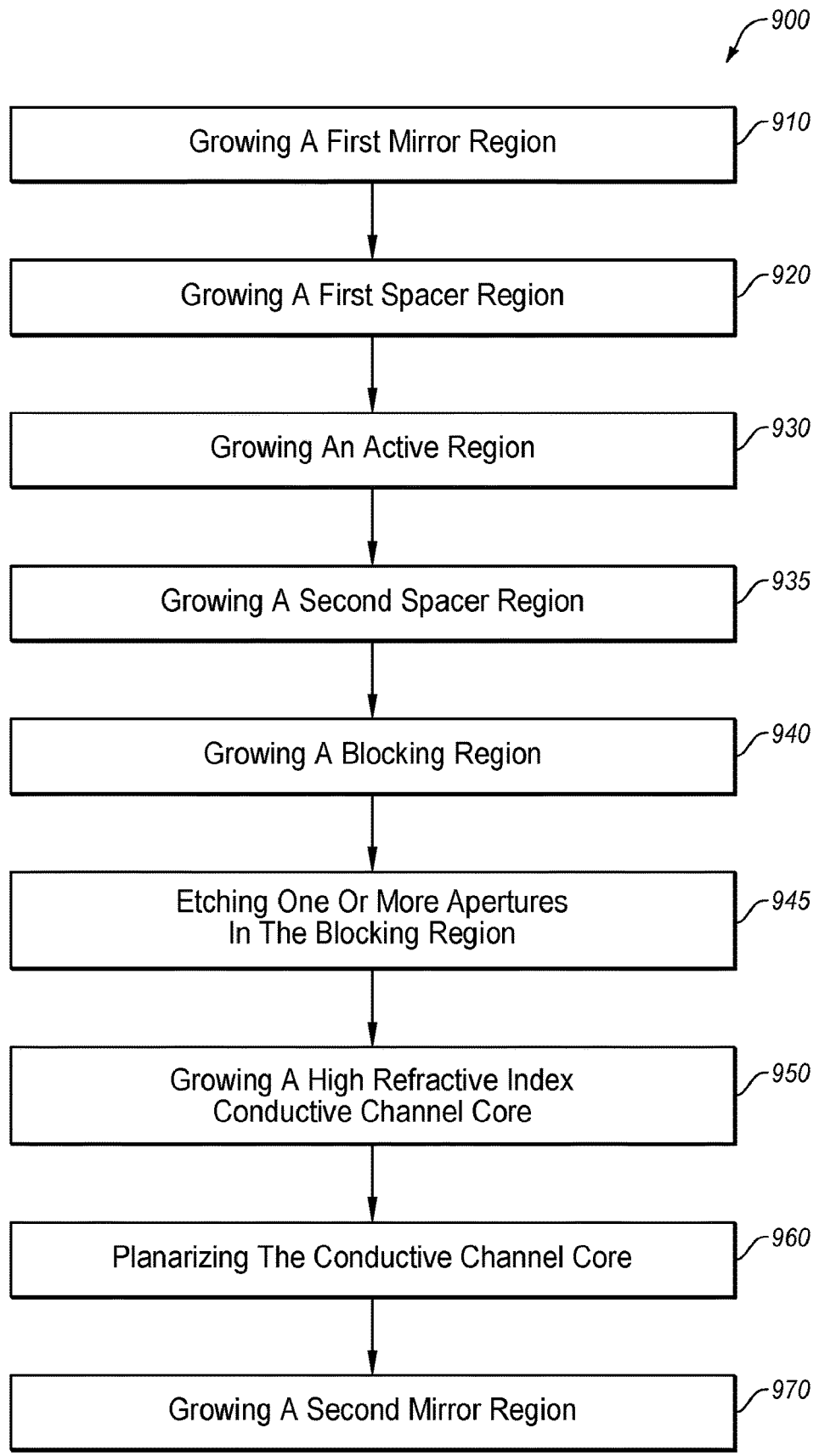
FIG. 9 is a flow diagram of an embodiment of a method of manufacturing a VCSEL.

FIG. 9 is a flow diagram of another process 900 of an embodiment of a method of manufacturing a VCSEL as described herein. The process can includes growing a first mirror region having a plurality of first mirror layers having one or more indices of refraction (block 910) and then (optionally) growing a first spacer region over the first mirror region (block 920). Then an active region is grown over the first spacer region (block 930) (or over first mirror when first spacer region not grown). Then an optional second spacer region is grown over the active region (block 935). Then a blocking region is grown over the second spacer region (block 940) (or active region when second spacer region not grown). Then etching one or more apertures in the blocking region (only the blocking region is etched, the active region is not etched, optionally some or all of the second blocking region can be etched) (block 945). Then the one or more apertures are filled with a high refractive index material (e.g., higher RI than blocking layer) (block 950) to form the conductive channel core. The process 900 can also include planarizing the conductive channel core, such as by forming the wings (block 960), and then growing a second mirror region having a plurality of second mirror layers having one or more indices of refraction (block 970).

Also, the active region or whole semiconductor layers of a VCSEL can be produced with molecular beam epitaxy (MBE). Lower growth temperatures during the MBE can be used to prepare the VCSEL semiconductor layers. The growth of these structures by MBE can be performed at < (less than) 500° C. Comparatively, the temperatures for MOCVD can be > (greater than) 600° C. Additionally, the VCSELs can be prepared by methods that are similar to MBE, such as GSMBE (gas source MBE) and MOMBE (metalorganic MBE) or the like that can produce the regions as described.

The chemical etching can be any that is useful and known in the art.

In one embodiment, the orientation of the blocking region and conductive region can be swapped, such that the blocking region is the core surrounded by the conductive region. Here, the conductive region includes an aperture having the blocking core.

In one embodiment, the lack of trenches and oxidation can result in the conductive cores (or central blocking region) being closer together than prior devices. Prior devices, due to trenches and oxidation, can have the cores (conductive or blocking) at about 21 to 25 microns apart, in an example. However, because the current device omits the trenches and oxidation, the cores (conductive or blocking) can be must closer together, such as 4 microns, or from 2-6 microns, of from 1-8 microns apart (center to center)

Now, with cores center to center at about 4 microns, for example, high density arrays can be achieved. The high density can allow for coherent arrays with cores with the same phase. Also, there can be some control of coherence of beams in a phased array, which can focus down to small spot for use in scanning. Additionally, more precise control of the high density array allows for laser weaponry to use the high density arrays achieved with the present technology.

The technology can allow coherent arrays, which means that all of the cores have the same phase or that you can control the phase between the cores, which can provide a laser beam that can be pointed to a desired location without physically turning the laser. In an example, a fighter plane there is a phased array in the nose that illuminates another fighter plane, and thereby the phased array can point anywhere. Control of the coherence of the beam of a phased array can allow for focus of the beam down to a small spot. Such control allows for the invention to be used in scanning applications. The control may also be useful in a laser weapon because the arrangement can distribute many of the cores over a large area, which can control the heat dissipation, and control of the phase of all of the cores can allow them to be combined, such as by focusing, so that all of the cores work together to combine their power to get a very large amount of power per unit area when focused.

In one embodiment, an etched planarized vertical cavity surface emitting laser (VCSEL) can include: an active region; a blocking region over the active region, the blocking region defining one or more apertures therein; and one or more conductive channel cores in the one or more apertures of the blocking region, wherein the one or more conductive channel cores and blocking region form an isolation region. In one aspect, the VCSEL can include a bottom mirror region below the active region, and a top mirror region above the isolation region. In one aspect, the VCSEL can include a bottom spacer region between the bottom mirror region and active region, and a top spacer region between the active region and blocking region. In one aspect, the conductive channel core extends through the blocking region and contacts the active region. In one aspect, the conductive channel core extending through the blocking region and contacts the top spacer region. In one aspect, the blocking region has a thickness from 1 nm to 500 nm, from 1 nm to 30 nm, from 1 nm to 10 nm, or from 1 nm to 3 nm. In one aspect, the conductive channel core has a thickness the same as the blocking region. In one aspect, the conductive channel core has a diameter of about 1 micron to about 10 microns. In one aspect, the conductive channel core has a diameter of about 2 micron to about 6 microns. In one aspect, the blocking region or blocking layer is InGaP. In one aspect, the conductive channel core is AlGaAs. In one aspect, the one or more conducive channel cores are planarized. In one aspect, the one or more conducive channel cores and top mirror are planarized.

In one embodiment, the VCSEL can include a plurality of the conductive channel cores in a common blocking region. In one aspect, the VCSEL can include up to five of the conductive channel cores in a common blocking region, or more than five.

In one embodiment, the conductive channel core has higher refractive index than the blocking region. In one aspect, the blocking region has a lower refractive index than the conductive channel core. In one aspect, the conductive channel core has a refractive index from about 3.7 to 3. In one aspect, the blocking region has a refractive index from about 3.7 to 3.

In one embodiment, an array of VCSELs can include a plurality of the individual VCSELs described herein in accordance with any embodiment.

In one embodiment, the VCSEL can exclude certain features common in VCSELS. In one aspect, the VCSEL is devoid of an oxide aperture. In one aspect, the VCSEL is devoid of oxidation. In one aspect, the VCSEL is devoid of a mesa.

In one embodiment, the VCSEL can include a conductive wing layer. In one aspect, the conductive wing layer is integrated with tops of the one or more conductive channel cores. In one aspect, the conductive wing layer is separate and in contact with tops of the one or more conductive channel cores.

In one embodiment, a method of making the VCSEL can include: forming the VCSEL having the active region; blocking region over the active region, the blocking region defining the one or more apertures therein; and the one or more conductive channel cores in the one or more apertures of the blocking region. In one aspect, the method can include forming the blocking region. In one aspect, the method can include forming the blocking region, and etching one or more of the apertures in the blocking region. In one aspect, the method can include: forming the blocking region; coating the top of the blocking region with a chemical agent that inhibits etching while leaving one or more regions without the chemical agent; and etching one or more of the apertures in the blocking region in the one or more regions without the chemical agent. In one aspect, the method can include: forming the blocking region; coating the top of the blocking region with a chemical agent that inhibits etching while leaving one or more regions without the chemical agent; etching one or more of the apertures in the blocking region in the one or more regions without the chemical agent; and filling the one or more of the apertures in the blocking region with the one or more conductive channel cores.

In one aspect, the method can include removing the chemical agent that inhibits the etching after the etching to form the apertures and before the filling of the aperture with the one or more conductive channel cores. In one aspect, the method can include removing the chemical agent that inhibits the etching after the filling of the aperture with the one or more conductive channel cores.

In one embodiment, the method can include forming the bottom mirror region below the active region, and forming the top mirror region above the active region, blocking region, and conductive channel core. In one aspect, the method can include forming the bottom spacer region between the bottom mirror region and active region, and forming the top spacer region between the active region and isolation region.

In one embodiment, the method can include forming the conductive channel core to extend through the blocking region and contact the active region. In one aspect, the method can include forming the conductive channel core to extend through the blocking region and contact the top spacer region. In one aspect, the method can include forming the plurality of the conductive channel cores in the common blocking region. In one aspect, the method can include forming the conductive channel core to have the higher refractive index than the blocking region. In one aspect, the method can include forming the blocking region have a lower refractive index than the conductive channel core.

In one embodiment, the method can include using MOCVD to form the one or more conductive channel cores. In one aspect, the method can include using MOCVD to form the one or more conductive channel cores, and form conductive plane with wings layer over the one or more conducive channel cores. In one embodiment, the method can include using MOCVD to form the one or more conductive channel cores, form conductive plane with wings layer over the one or more conducive channel cores, and form the top mirror over the one or more conducive plane with wings layer.

In one embodiment, various layers can be planarized. In one aspect, the method can include planarizing the top mirror. In one aspect, the method can include forming the one or more conducive channel cores to be planarized. In one aspect, the method can include forming the one or more conducive channel cores and top mirror to be planarized.

In one embodiment, the method can include forming an array of the VCSELs.

In one embodiment, the method can include forming the conductive wing layer integrated with tops of the one or more conductive channel cores. In one aspect, the method can include forming the conductive wing layer separate and in contact with tops of the one or more conductive channel cores.

In one embodiment, an etched planarized vertical cavity surface emitting laser (VCSEL) can include: an active region; a conductive channel region over the active region, the conductive channel region defining one or more apertures therein; and one or more blocking cores in the one or more apertures of the conductive channel region, wherein the one or more blocking cores and conductive channel regions form an isolation region. Accordingly, the elements recited herein may be applied to such a VCSEL that has the blocking member as a blocking core instead of the conductive member being the conducive core. Modifications in accordance with this embodiment are included herein. The methods of manufacturing may also be modulated so that the blocking member as a blocking core instead of the conductive member being the conducive core One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is also to be understood that the terminology used herein is for the purpose of describing particular embodiments only, and is not intended to be limiting.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

All references recited herein are incorporated herein by specific reference in their entirety.

The invention claimed is:

1. A vertical cavity surface emitting laser (VCSEL) array comprising:
    an active region;
    a blocking region disposed above the active region and including a plurality of laterally arranged apertures, wherein the blocking region includes a first material having a first refractive index and being devoid of oxidation;
    a plurality of conductive channel cores in the plurality of laterally arranged apertures, wherein each conductive channel core includes a second material having a second refractive index and being devoid of oxidation, wherein the first refractive index is less than the second refractive index;
    a bottom mirror region disposed below the active region;
    a top mirror region disposed above the conductive channel cores; and
    a light emitting surface associated with the plurality of conductive channel cores; and
    wherein the plurality of conductive channel cores, the top mirror region, and the light emitting surface are planarized.

2. The VCSEL array of claim 1, wherein the VCSEL array is devoid of a mesa structure.

3. The VCSEL array of claim 1, wherein the plurality of conductive channel cores and the blocking region form an isolation region.

4. The VCSEL array of claim 1, wherein the bottom mirror region is disposed below the plurality of conductive channel cores.

5. The VCSEL array of claim 1, wherein the blocking region comprises a thickness from 1 nm to 500 nm and at least one of the conductive channel cores comprises a diameter of about 1 micron to about 10 microns.

6. The VCSEL array of claim 1, wherein the VCSEL array is devoid of an oxide aperture or oxidation.

7. The VCSEL array of claim 1, further comprising a conductive wing layer that extends between and connects the plurality of conductive channel cores.

8. The VCSEL of claim 1, wherein the conductive channel cores are separated from each other by about 1 micron to 10 microns.

9. A method of making a VCSEL array, comprising:
    forming an active region over a substrate;
    forming a blocking region over the active region, wherein the blocking region includes a first material having a first refractive index and being devoid of oxidation;
    etching a plurality of apertures in the blocking region; and
    forming a plurality of conductive channel cores in the plurality of apertures of the blocking region, wherein each conductive channel core includes a second material having a second refractive index and being devoid of oxidation, wherein the first refractive index is less than the second refractive index;
    forming a top mirror region above the conductive channel cores; and
    planarizing the plurality of conductive channel cores, the top mirror region, and a light emitting surface.

10. The method of claim 9, further comprising:
    coating a top of the blocking region with a chemical agent that inhibits etching while leaving a plurality of regions without the chemical agent; and
    etching the plurality of the apertures in the blocking region in the plurality of regions without the chemical agent.

11. The method of claim 10, further comprising filling the plurality of the apertures in the blocking region with the plurality of conductive channel cores by MOCVD.

12. The method of claim 10, further comprising removing the chemical agent that inhibits the etching after the etching to form the plurality of apertures and before the filling of the plurality of apertures with the plurality of conductive channel cores.

13. The method of claim 9, further comprising forming the conductive channel core to extend through the blocking region and contact the active region or contact a top spacer region that is above the active region.

14. The method of claim 9, further comprising forming a conductive wing layer that extends between and connects the plurality of conductive channel cores.

15. An etched planarized vertical cavity surface emitting laser (VCSEL) array comprising:
    an active region;
    a conductive region above the active region and defining a plurality of apertures, wherein the conductive region includes a second material having a second refractive index and being devoid of oxidation;
    a plurality of blocking cores in the apertures of the conductive region, wherein each blocking core includes a first material having a first refractive index and being devoid of oxidation, wherein the first refractive index is less than the second refractive index;
    a bottom mirror region below the active region; and
    a top mirror region above the conductive region;
    wherein the conductive region, plurality of blocking cores, the top mirror region, and light emitting surface are planarized.

16. The VCSEL array of claim 15, wherein the VCSEL array is devoid of a mesa.

17. The VCSEL array of claim 15, wherein the blocking region is InGaP and the conductive channel cores are AlGaAs.

18. The VCSEL array of claim 15, wherein each conductive channel core has a center point, and a distance between each center point is about 2 microns to about 6 microns.

19. A method of making the VCSEL of claim 15, comprising:
- forming the active region over a substrate;
- forming the conductive region over the active region, wherein the conductive region includes a second material having a second refractive index and being devoid of oxidation;
- etching the plurality of apertures in the conductive region; and
- forming the plurality of blocking cores in the plurality of apertures of the conductive region, wherein each blocking core includes a first material having a first refractive index and being devoid of oxidation, wherein the first refractive index is less than the second refractive index.

* * * * *